(12) United States Patent
Jang

(10) Patent No.: US 7,678,677 B2
(45) Date of Patent: Mar. 16, 2010

(54) SEMICONDUCTOR DEVICE AND MANUFACTURING METHOD THEREOF

(75) Inventor: Jeong Yel Jang, Chungbuk (KR)

(73) Assignee: Dongbu HiTek Co., Ltd., Seoul (KR)

( * ) Notice: Subject to any disclaimer, the term of this patent is extended or adjusted under 35 U.S.C. 154(b) by 126 days.

(21) Appl. No.: 11/880,473

(22) Filed: Jul. 20, 2007

(65) Prior Publication Data

US 2008/0017938 A1    Jan. 24, 2008

(30) Foreign Application Priority Data

Jul. 21, 2006    (KR) .................. 10-2006-0068529

(51) Int. Cl.
H01L 29/94    (2006.01)

(52) U.S. Cl. ............... 438/591; 257/411; 257/E21.268; 257/E29.266

(58) Field of Classification Search ........... 257/315, 257/321, 288, 411, E29.345, E29.266, E21.268; 438/294, 591
See application file for complete search history.

(56) References Cited

U.S. PATENT DOCUMENTS

| 6,372,657 | B1 | 4/2002 | Hineman et al. | |
|---|---|---|---|---|
| 6,436,841 | B1* | 8/2002 | Tsai et al. | 438/738 |
| 2005/0064727 | A1* | 3/2005 | Lee et al. | 438/781 |
| 2005/0224859 | A1* | 10/2005 | Iwata et al. | 257/315 |
| 2007/0141795 | A1* | 6/2007 | Park | 438/294 |

FOREIGN PATENT DOCUMENTS

| CN | 1127425 A | 7/1996 |
|---|---|---|
| DE | 10 2006 059 427 A1 | 7/2007 |
| GB | 2293795 A | 10/1996 |
| JP | 2003-332474 A | 11/2003 |

OTHER PUBLICATIONS

Korean Office Action dated May 28, 2007; Korean Patent Application No. 10-2006-0068529; Korean Intellectual Property Office, Republic of Korea.
Hiroshi Iwata and Akihide Shibata; "Semiconductor Memory"; esp@cenet; Abstract of Publication No. JP2003332474; Publication Date: Nov. 21, 2003; esp@cenet database—Worldwide.
Semiconductor Memory; Priority No. 2002056694; Priority Date: Apr. 3, 2002; Priority Country: JP; Abstract Only.

(Continued)

*Primary Examiner*—Thomas L Dickey
*Assistant Examiner*—Fazli Erdem
(74) *Attorney, Agent, or Firm*—The Law Offices of Andrew D. Fortney; Andrew D. Fortney; Theresa J. Mahan

(57) ABSTRACT

A method for manufacturing a semiconductor device includes: forming a device isolation layer in a semiconductor substrate; forming a gate insulating layer and a gate electrode on the semiconductor substrate; depositing a triple layer over the resulting structure, the triple layer including a bottom oxide layer, a nitride oxide layer and a top oxide layer; and etching the triple layer to form spacers.

20 Claims, 2 Drawing Sheets

OTHER PUBLICATIONS

Hiroshi Ogawa; "Method for Cleaning Vacuum Processing Chamber Which Process by Bromide Gas"; esp@cenet; Abstract of Publication No. CN1127425; Publication Date: Jul. 24, 1996; esp@cenet database—Worldwide.

German Office Action; Application No. DE 10-2007-033-918.8-33; Dated: Jun. 12, 2008; German Intellectual Property Office; Munich, Germany.

Jin Ha Park; Method of Forming Compressive Channel Layer of PMOS Device Using Gate Spacer and PMOS Device Having a Compressed Channel Layer; German Patent Abstract; Publication No. DE102006059427; Publication Date: Jul. 12, 2007; esp@cenet database—Worldwide.

* cited by examiner

SEMICONDUCTOR DEVICE AND MANUFACTURING METHOD THEREOF

CROSS-REFERENCE TO RELATED APPLICATIONS

The present invention claims priority under 35 U.S.C. 119 and 35 U.S.C. 365 to Korean Patent Application No. 10-2006-0068529 (filed on Jul. 21, 2006), which is hereby incorporated by reference in its entirety.

BACKGROUND

The present disclosure relates to a semiconductor device having oxide-nitride-oxide (ONO) spacers and a manufacturing method thereof.

As semiconductor devices are highly integrated, a short channel effect occurs due to reduction of a channel length. Also, the short channel effect causes a punch through phenomenon.

In semiconductor devices, spacers are used to form a low-concentration junction region for preventing the punch through phenomenon. More specifically, the spacers are used for electrically separating adjacent gate electrodes from each other.

A method for forming spacers includes forming a device isolation layer on a semiconductor substrate, forming a gate insulating layer and a gate electrode, depositing an insulating layer to cover the gate electrode and the semiconductor substrate, and dry-etching the resulting structure to form spacers.

During the etching process for forming the spacers, however, the insulating layer formed on the semiconductor substrate and an oxide layer formed within the device isolation layer are etched together, degrading electrical properties of the semiconductor device.

SUMMARY

Embodiments provide a semiconductor device and a manufacturing method thereof, in which spacers are formed by depositing and etching a triple layer with oxide-nitride-oxide layers, thereby preventing the loss of an oxide layer formed within a device isolation layer.

In one embodiment, a method for manufacturing a semiconductor device includes: forming a device isolation layer in a semiconductor substrate; forming a gate insulating layer and a gate electrode on the semiconductor substrate; depositing a triple layer over the resulting structure, the triple layer including a bottom oxide layer, a nitride oxide layer, and a top oxide layer; and etching the triple layer to form spacers.

In another embodiment, a semiconductor substrate includes: a semiconductor substrate; a device isolation layer having a trench filled with an oxide layer; a gate insulating layer disposed on the semiconductor substrate; a gate electrode disposed on the gate insulating layer; and a spacer disposed on a side of the gate electrode and a side of the gate insulating layer, the spacer including a triple layer having a bottom oxide layer, a nitride layer, and a top oxide layer.

The details of one or more embodiments are set forth in the accompanying drawings and the description below. Other features will be apparent from the description and drawings, and from the claims.

DETAILED DESCRIPTION OF THE EMBODIMENTS

Embodiments of a semiconductor device and a manufacturing method thereof will be described below in detail with reference to the accompanying drawings.

In the following description, it will be understood that when a layer is referred to as being 'on' another layer or substrate, it can be directly on the other layer or substrate, or intervening layers may also be present. Further, it will be understood that when a layer is referred to as being 'under' another layer, it can be directly under the other layer, and one or more intervening layers may also be present. In addition, it will also be understood that when a layer is referred to as being 'between' two layers, it can be the only layer between the two layers, or one or more intervening layers may also be present.

Figure 1:
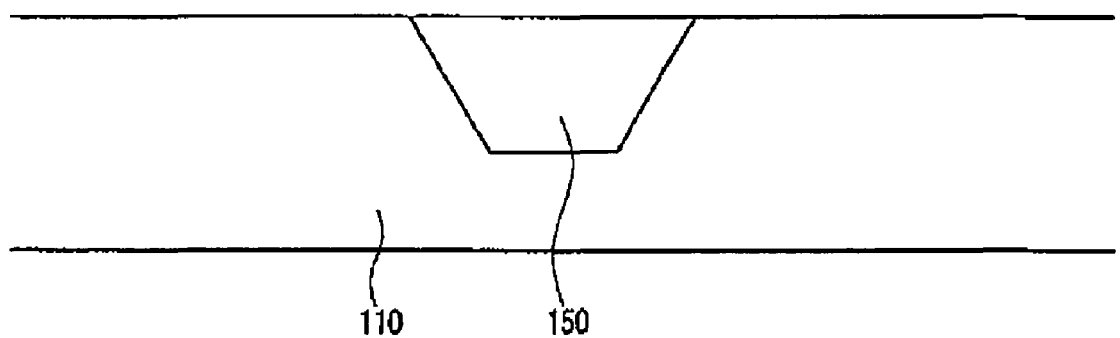
FIG. 1 is a side sectional view of a semiconductor device when a device isolation layer is formed according to an embodiment of a method for manufacturing a semiconductor device.

FIG. 1 is a side sectional view of a semiconductor device when a device isolation layer 150 is formed according to an embodiment of a method for manufacturing a semiconductor device.

Referring to FIG. 1, a trench is formed in a predetermined location of a semiconductor substrate 110, which is defined for forming a device isolation layer. The trench is filled with an oxide layer to form a device isolation layer 150.

The device isolation layer 150 electrically isolates adjacent semiconductor devices from each other.

Figure 2:
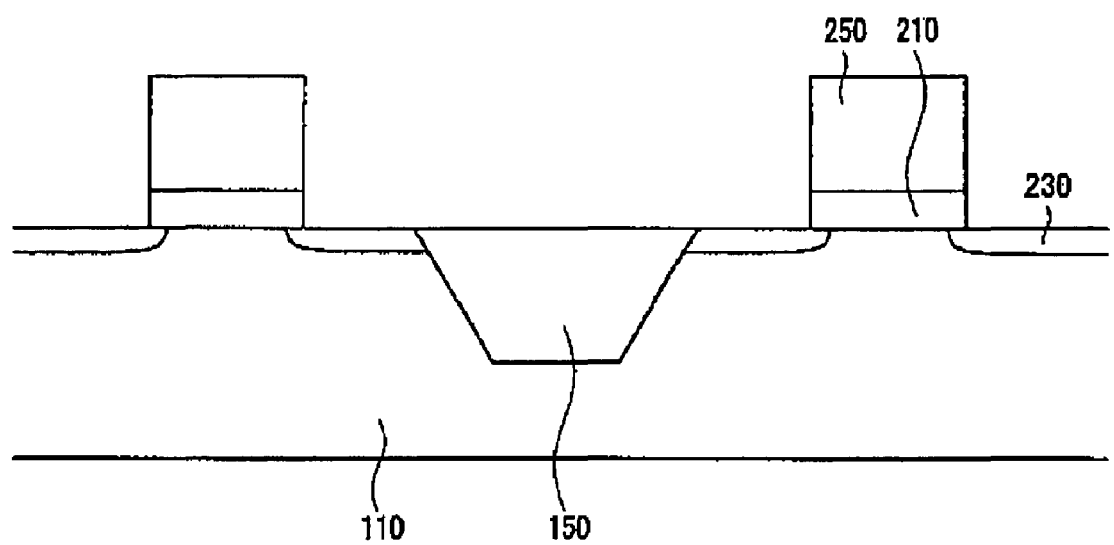
FIG. 2 is a side sectional view of a semiconductor device when a gate electrode is formed according to the embodiment of the method for manufacturing the semiconductor device.

FIG. 2 is a side sectional view of a semiconductor device when a gate electrode 250 is formed according to the embodiment of the method for manufacturing the semiconductor device.

Referring to FIG. 2, an insulating layer is deposited on the semiconductor substrate 110 where the device isolation layer 150 is formed, and a polysilicon layer is deposited on the insulating layer. The gate insulating layer 210 may comprise silicon dioxide (e.g., a thermal oxide) and/or a high dielectric constant material (e.g., silicon nitride, silicon oxynitride, hafnium dioxide, etc.). Then, the insulating layer and the polysilicon layer are etched using a mask (not shown) to form a gate insulating layer 210 and a gate electrode 250, respectively. The gate insulating layer 210 and the gate electrode 250 are disposed in a region where no device isolation layer is formed.

Figure 3:
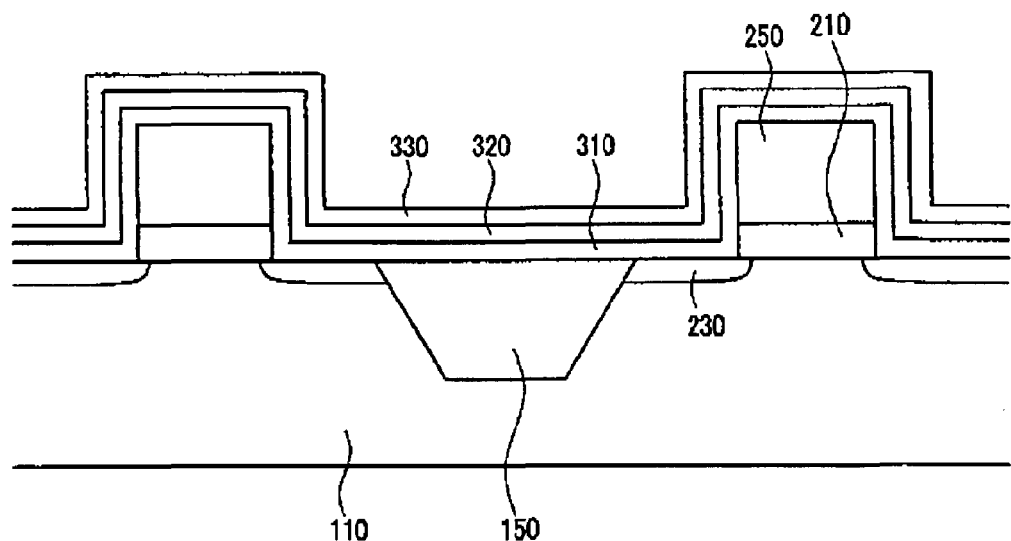
FIG. 3 is a side sectional view of a semiconductor device when oxide-nitride-oxide layers are formed according to the embodiment of the method for manufacturing the semiconductor device.

FIG. 3 is a side sectional view of a semiconductor device when an oxide-nitride-oxide (ONO) structure is formed according to the embodiment of the method for manufacturing the semiconductor device.

Referring to FIG. 3, a triple layer with an ONO structure having a bottom oxide layer 310, a nitride layer 320, and a top oxide layer 330 is formed over the semiconductor substrate 110 where the gate insulating layer 210 and the gate electrode 250 are formed. An ion implantation process may be performed before the formation of the ONO structure on the semiconductor substrate 110 to form, for example, lightly-doped source/drain extension regions 230 (see, e.g., FIG. 2). In this case, ion implantation concentration may be low.

Referring back to FIG. 3, the bottom oxide layer 310 and the top oxide layer 330 may be formed of same material or different material from each other (e.g., a TEOS- or silane-based oxide, which may be conformally deposited by chemical vapor deposition [CVD], which in turn may be low-, atmospheric- or high pressure and/or plasma-enhanced or high density plasma [HDP]-assisted). Further, the bottom oxide layer 310 and the top oxide layer 330 may be formed of same material as or different material from that of an oxide layer disposed within the device isolation layer 150.

Figure 4:
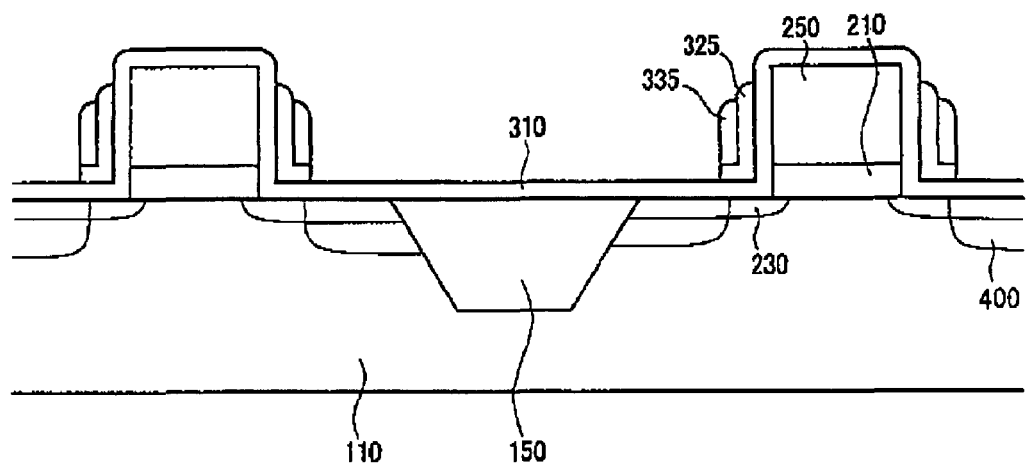
FIG. 4 is a side sectional view of a semiconductor device when spacers are formed by an etching process according to the embodiment of the method for manufacturing the semiconductor device.

FIG. 4 is a side sectional view of a semiconductor device when spacers are formed by an etching process according to the embodiment of the method for manufacturing the semiconductor device.

Referring to FIG. 4, the semiconductor substrate 110 where the ONO layer 310, 320 and 330 is formed is etched without using any separate mask to form spacers having an oxide layer 315, a nitride layer 325, and an oxide layer 335.

The triple layer having the bottom oxide layer 310, the nitride layer 320, and the top oxide layer 330 is etched in two steps.

A first etching process is to etch the top oxide layer 330 and the nitride layer 320. At this time, a dry etching process (which may have a relatively low etch selectivity, such as from 1:1 to 3:1) may be used.

The first etching process may be performed under the following exemplary process conditions.

First, a gap between a top electrode and a bottom electrode of an etching apparatus, that is, a gap between electrodes where a semiconductor substrate is placed, is maintained in the range of 20-40 mm. Second, an internal pressure of a reaction chamber is maintained within the range of 100-150 mT.

Third, power of 200-250 W is supplied to the etching apparatus. Fourth, $Cl_2$ having a flow rate of 80-150 sccm, HBr having a flow rate of 10-50 sccm, and $O_2$ having a flow rate of 0-20 sccm are injected into the etching apparatus.

In addition, the first etching process can be stopped (e.g., have an etch stop point) by monitoring a waveform (e.g., a light absorption) of one or more CN compounds generated in etching the nitride layer 320. Thus, one may determine an end point of the first etching process by spectroscopy (e.g., detecting a decrease in the light absorption of one or more wavelengths of light, characteristic of one or more etching by-products having both carbon and nitrogen atoms therein).

The second etching process is to completely remove the nitride layer 320 remaining after the first etching process to expose the bottom oxide layer 310. The second etching process generally has high selectivity for etching nitride relative to oxide (e.g., a selectivity of 5:1, 10:1, 20:1 or higher).

The second etching process can be performed under the following exemplary process conditions.

First, the gap between the top electrode and the bottom electrode is maintained in the range of 10-30 mm. Second, the internal pressure of the reaction chamber is maintained within the range of 100-150 mT.

Third, power of 200-500 W is supplied to the etching apparatus. Fourth, $Cl_2$ having a flow rate of 80-150 sccm, HBr having a flow rate of 0-50 sccm, and $O_2$ having a flow rate of 0-20 sccm are injected into the etching apparatus.

Through the two-step etching process, the spacers and the exposed bottom oxide layer 310 are formed as illustrated in FIG. 4. The bottom oxide layer 310 can prevent the oxide layer 150 of the device isolation layer from being etched.

Further, even though the etching process may be performed for a relatively long time, the oxide layer 150 of the device isolation layer is protected until the bottom oxide layer 310 is completely etched. In some embodiments, the exposed bottom oxide layer 310 outside the spacer region may be etched and removed. Then, an ion implantation process and a silicide forming process may be performed to form source/drain terminals 400 in the exposed active regions of the semiconductor device and ohmic contacts thereto.

Alternatively, after ion implantation to form source/drain terminals 400, a bulk dielectric (e.g., a pre-metal dielectric layer which may comprise a [nitride] etch stop layer, a bulk [boron and/or phosphorous] doped silicon oxide layer, and a "hard" undoped oxide layer [such as USG] and/or a "soft" oxide layer [such as a TEOS-based oxide]) may be deposited on the exposed bottom oxide layer 310. Thereafter, contact and/or interconnect holes and (optional) trenches may be conventionally patterned, etched and removed, and a metal silicide formed on the exposed silicon surfaces prior to forming the metal contacts and/or interconnects.

The above-described manufacturing processes may be performed in a capacitive coupled plasma (CCP) apparatus.

A structure of the semiconductor device will be described below with reference to FIG. 4.

Referring to FIG. 4, a device isolation layer 150 is formed in a semiconductor substrate 110. The device isolation layer 150 may be formed by forming a trench in the semiconductor substrate 110 and filling the trench with an oxide layer.

A semiconductor device is formed in a region where no device isolation layer is formed. A gate insulating layer 210 is formed on the semiconductor substrate 110, and a gate electrode 250 is formed on the gate insulating layer 210.

Spacers are formed on both sides of the gate electrode 250. The spacers includes a triple layer having a bottom oxide layer 315, a nitride layer 325, and a top oxide layer 335.

In particular, the bottom oxide layer 315 contacts a side of the gate electrode 250 and a side of the gate insulating layer 210. Further, the bottom oxide layer 315 is formed over an entire region of the semiconductor substrate 110 other than the region where the gate insulating layer 210 is formed. The bottom oxide layer 315 is also formed on the device isolation layer 150.

As described above, since the oxide-nitride-oxide layer is deposited and etched to form the spacers, the etching of the oxide layer disposed within the device isolation layer can be prevented. Therefore, the semiconductor devices are not shorted, thereby improving electric characteristics of the device isolation layer.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing a semiconductor device, comprising:
   forming a device isolation layer in a semiconductor substrate;
   forming a gate insulating layer and a gate electrode on the semiconductor substrate;
   depositing a triple layer over the resulting structure, the triple layer including a bottom oxide layer, a nitride layer, and a top oxide layer; and
   etching the top oxide layer and nitride layer of the triple layer by a first etching process having an etch selectivity of 3:1 or lower, and subsequently removing a remaining portion of the nitride layer by a second process having an etch selectivity of at least 10:1, thereby exposing the bottom oxide layer remaining on the device isolation layer, to form spacers.

2. The method according to claim 1, wherein forming the device isolation layer comprises:
   forming a trench in the semiconductor substrate; and
   filling the trench with an oxide layer.

3. The method according to claim 1, wherein the first etching process (the top oxide layer and nitride layer) comprises etching the top oxide layer in a first step and etching the nitride layer in a second step.

4. The method according to claim 1, wherein the first etching process is carried out in an etching apparatus having a gap between a top electrode and a bottom electrode in the range of 20-40 mm, an internal reaction chamber pressure in the range of 100-150 mT, and a power supply of 200-250 W.

5. The method according to claim 4, wherein the first etching process comprises supplying $Cl_2$ at a flow rate in the range of 80-150 sccm, HBr at a flow rate in the range of 10-50 sccm, and $O_2$ at a flow rate in the range of 0-20 sccm.

6. The method according to claim 1, wherein the first etching process determines an etch stop point using a characteristic of a CN compound generated in etching the nitride layer.

7. The method according to claim 1, wherein the second process is carried out in an etching apparatus having a gap between a top electrode and a bottom electrode in the range of 10-30 mm, an internal reaction chamber pressure in the range of 100-150 mT, and a power supply of 200-500 W.

8. The method according to claim 7, wherein the second process comprises supplying $Cl_2$ at a flow rate in the range of 80-150 sccm, HBr at a flow rate in the range of 0-50 sccm, and $O_2$ at a flow rate in the range of 0-20 sccm.

9. The method according to claim 1, wherein forming the device isolation layer, forming the gate insulating layer and the gate electrode, depositing the triple layer, and forming the spacers are carried out within a capacitive coupled plasma (CCP) apparatus.

10. The method according to claim 1, wherein forming the spacers further exposes the bottom oxide layer on an uppermost surface of the gate electrode.

11. The method according to claim 10, further comprising forming a dielectric layer on the exposed bottom oxide layer.

12. The method according to claim 11, wherein the dielectric layer comprises a nitride etch stop layer, a boron and/or phosphorous doped silicon oxide layer, and a undoped oxide layer, and/or a TEOS-based oxide layer.

13. The method according to claim 1, further comprising etching the exposed bottom oxide layer to form an exposed active region.

14. The method according to claim 13, further comprising ion implantation and silicide forming process to form source and drain terminals in the exposed active region.

15. A semiconductor substrate, comprising:
   a semiconductor substrate;
   a device isolation layer in a trench in the substrate, the device isolation layer comprising an oxide layer that fills the trench;
   a gate insulating layer on the semiconductor substrate;
   a gate electrode on the gate insulating layer; and
   a spacer on a side of the gate electrode and a side of the gate insulating layer, the spacer including a triple layer having a bottom oxide layer on the device isolation layer and at least a top surface and sidewalls of the gate electrode and, a nitride layer, and a top oxide layer; and
   a bulk dielectric layer directly on an exposed surface of the bottom oxide layer.

16. The semiconductor device according to claim 15, wherein the bottom oxide layer contacts the gate electrode in a region where no gate insulating layer is formed.

17. The semiconductor device according to claim 15, wherein the top oxide layer, the bottom oxide layer, and the device isolation layer comprise a same material.

18. The semiconductor device according to claim 15, wherein the top oxide layer and the bottom oxide layer comprise a same material, and the oxide layer of the device isolation layer comprises a material different from that of the top oxide layer and the bottom oxide layer.

19. The semiconductor device according to claim 15, wherein the top oxide layer and the bottom oxide layer comprise different materials, and the oxide layer of the device isolation layer comprises a same material as one of the top oxide layer and the bottom oxide layer.

20. The semiconductor device according to claim 15, wherein the top oxide layer, the bottom oxide layer, and the device isolation layer comprise different materials from one another.

* * * * *